(12) United States Patent
Braithwaite

(10) Patent No.: US 7,995,976 B2
(45) Date of Patent: Aug. 9, 2011

(54) SYSTEM AND METHOD USING THE PILOT FREQUENCY FROM A POSITIVE FEEDBACK PILOT SYSTEM TO IMPROVE SECOND LOOP CONVERGENCE FOR A FEEDFORWARD AMPLIFIER

(75) Inventor: Richard Neil Braithwaite, Orange, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 1040 days.

(21) Appl. No.: 11/820,203

(22) Filed: Jun. 18, 2007

(65) Prior Publication Data

US 2008/0019532 A1    Jan. 24, 2008

Related U.S. Application Data

(63) Continuation-in-part of application No. 11/392,170, filed on Mar. 29, 2006, now Pat. No. 7,756,493.

(60) Provisional application No. 60/668,363, filed on Apr. 5, 2005, provisional application No. 60/670,908, filed on Apr. 13, 2005, provisional application No. 60/816,808, filed on Jun. 27, 2006.

(51) Int. Cl.
*H04B 1/04* (2006.01)
(52) U.S. Cl. ............... 455/127.1; 455/127.3; 455/232.1
(58) Field of Classification Search .... 455/127.1–127.4, 455/232.1–234.2; 330/151, 52
See application file for complete search history.

(56) References Cited

U.S. PATENT DOCUMENTS

| | | | | |
|---|---|---|---|---|
| 4,885,551 | A * | 12/1989 | Myer | 455/127.1 |
| 5,166,634 | A * | 11/1992 | Narahashi et al. | 330/151 |
| 5,323,119 | A * | 6/1994 | Powell et al. | 330/151 |
| 5,386,198 | A * | 1/1995 | Ripstrand et al. | 330/52 |
| 5,565,814 | A * | 10/1996 | Fukuchi | 455/232.1 |
| 6,794,933 | B2 | 9/2004 | Gurvich et al. | |
| 7,123,086 | B2 | 10/2006 | Braithwaite | |
| 7,756,493 | B2 | 7/2010 | Braithwaite | |
| 2006/0176113 | A1 * | 8/2006 | Braithwaite et al. | 330/52 |
| 2006/0222104 | A1 | 10/2006 | Braithwaite | |

OTHER PUBLICATIONS

R. N. Braithwaite, "Positive feedback pilot generation and detection for use in feedforward loop control," in *IEEE MTT-S Int. Microwave Symp. Digest*, Jun. 2005.
N. Pothecary, *Feedforward Linear Power Amplifiers*, Norwood, MA: Artech House Inc., 1999.

* cited by examiner

*Primary Examiner* — Lana N Le
(74) *Attorney, Agent, or Firm* — OC Patent Law Group

(57) ABSTRACT

A method for controlling alignment of a control loop in an amplifier system includes generating a pilot signal and injecting the pilot signal into the amplifier system. Any uncanceled pilot signal is detected at an output of the control loop. A frequency of the generated pilot signal is detected and is used in adjusting one or more parameters of the control loop. The adjusting is performed at a predetermined direction and with a predetermined step size. A frequency change in the pilot signal in response to the adjusting is detected. The control loop is iteratively aligned by controlling the adjusting based on the detected frequency change, and the step size is determined based on the detected frequency change.

19 Claims, 8 Drawing Sheets

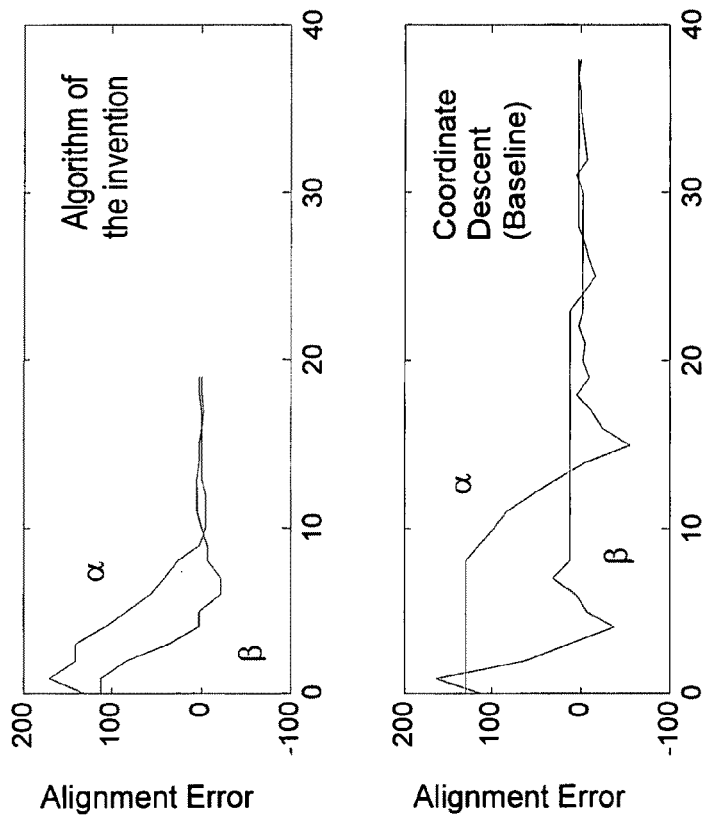
FIG. 9A
FIG. 9B
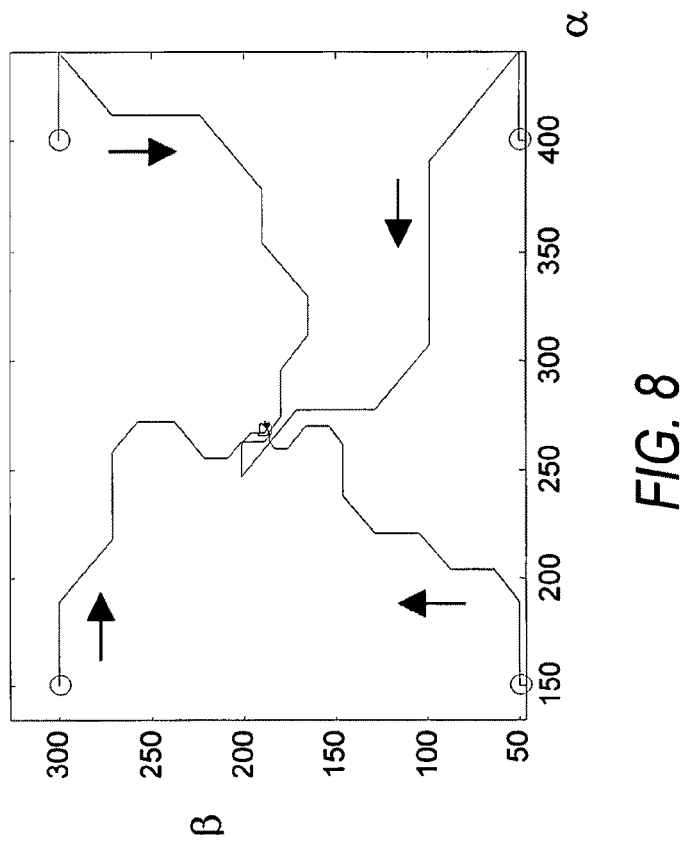
FIG. 8

SYSTEM AND METHOD USING THE PILOT FREQUENCY FROM A POSITIVE FEEDBACK PILOT SYSTEM TO IMPROVE SECOND LOOP CONVERGENCE FOR A FEEDFORWARD AMPLIFIER

CROSS-REFERENCE TO RELATED APPLICATIONS

The present application is a continuation in part of U.S. patent application Ser. No. 11/392,170, filed Mar. 29, 2006 now U.S. Pat. No. 7,756,493, which claims priority of U.S. Provisional Patent Application Ser. No. 60/668,363 filed Apr. 5, 2005, and of U.S. Provisional Application Ser. No. 60/670,908 filed Apr. 13, 2005. The present application also claims priority under 35 USC section 119(e) to U.S. Provisional Patent Application Ser. No. 60/816,808, filed Jun. 27, 2006. The disclosures of the above-identified patent applications are herein incorporated by reference in their entirety.

BACKGROUND OF THE INVENTION

1. Field of the Invention

The present invention relates to radio frequency (RF) power amplifiers and amplification methods. More particularly, the present invention relates to feed forward power amplifiers and methods of using a pilot to align the loops of a feed forward amplifier.

2. Description of the Prior Art and Related Information

A primary goal of RF power amplifier design is linearity over the range of power operation. Linearity is simply the ability to amplify without distortion. This requirement is critical for modern wireless communication systems but it is increasingly difficult to achieve. This is due primarily to the bandwidth requirements of modern wireless communication systems and the use of spectrally efficient modulation formats with high peak power relative to the average power which are placing increasing demands on amplifier linearity.

Feed forward compensation is a well known approach applied to amplifiers to improve linearity by estimating and canceling distortion. In feed forward RF power amplifiers, an error amplifier is employed to amplify only distortion components which are then combined with the main amplifier output to cancel the main amplifier distortion component.

FIG. 1 illustrates a conventional feed forward amplifier design. The system has in RF input and an RF output. The RF signal may be a high bandwidth signal such as a CDMA (Code Division Multiple Access) spread spectrum communication signal or WCDMA (Wide Code Division Multiple Access) signal, or other RF signals.

The system includes a main amplifier 1 and an error amplifier 2. The basic elements also include delays 3, 4 in the main and error paths, respectively, and main to error path couplers 5, 6, 7 and 8. Additional elements not shown are also typically present in a conventional feed forward architecture as is well known to those skilled in the art. The delays, couplers and error amplifier are designed to extract distortion components from the main path and inject out of phase distortion components from the error path into the main amplifier output at coupler 8 to substantially eliminate the distortion component in the main amplifier path.

The performance of a feed forward amplifier may typically be analyzed based on two cancellation loops. The first loop, called the carrier cancellation loop, ideally provides a signal at the output of coupler 7 with the input RF carrier component cancelled and only a distortion component remaining. The second loop is referred to as the error cancellation loop or auxiliary path loop. In the second loop the distortion component provided from coupler 7 is amplified by the error amplifier 2 and injected at coupler 8 to cancel the distortion component in the main path and ideally provide a distortion free signal at the output.

The quality of the distortion estimate (carrier cancellation) is determined by the alignment of the first loop in terms of gain magnitude and phase, if the alignment is controlled by gain and phase adjusters, or the in-phase (I) and quadrature (Q) components of the complex gain, if the alignment is controlled by a vector modulator. The distortion cancellation in turn is determined by the alignment of the second loop in terms of the complex gain. In prior art systems, a pilot 9 is injected into the main amplifier path of the first loop, acting like a known distortion signal. The pilot signal is detected at the feed forward amplifier output by a pilot detector 10 and used to aid the alignment process for the second loop. When the second loop is aligned, the pilot is cancelled. If the second loop is misaligned, residual pilot power will be detected at the output of the feed forward amplifier. The degree of the misalignment is estimated from the measured power of the residual pilot. The alignment of the second loop is adjusted in an iterative manner with the goal of reducing the residual pilot power. Generally, it is desirable to have the feed forward amplifier control system adapt to the optimal settings as fast as possible to minimize the amount of time the amplifier operates at a less than optimal setting.

One difficulty with alignment control algorithms used to adjust the alignment settings (I and Q components of the complex gain) from any initial setting to that which results in the best measured alignment is the difficulty in finding the correct direction of adjustment in the two dimensional (2D) I-Q space. Prior alignment control algorithms typically rely on either the "steepest descent" or the "coordinate descent" algorithms. The steepest descent algorithm adjusts the alignment settings in a direction of the gradient within the 2D I-Q space. Dithering the alignment in orthogonal directions and measuring the changes in measured misalignment provides an estimate of the gradient. The coordinate descent algorithm performs two separate 1D searches along pre-defined orthogonal directions (usually the I and Q axes). The alignments are dithered to determine which direction along the respective coordinates reduces measured misalignment. Both these approaches have disadvantages in practical systems which employ control processors with limited processing power and where fast loop alignment is desired. As a result the desired fast and accurate loop convergence has not been achieved in practical adaptive feed forward systems.

Accordingly, a need presently exists for a system and method for more rapid loop alignment control in a feed forward amplifier system.

SUMMARY OF THE INVENTION

In view of the foregoing, the following system and methods provide improved loop alignment control in a feed forward amplifier system.

In a first aspect, the present invention provides a method for controlling alignment of a control loop in an amplifier system. The method includes generating a pilot signal and injecting the pilot signal into the amplifier system, detecting any uncanceled pilot signal at an output of the control loop, detecting a frequency of the generated pilot signal, adjusting one or more parameters of the control loop at a predetermined direction and with a predetermined step size, detecting a frequency change in the pilot signal in response to the adjusting, and iteratively aligning the control loop by controlling the adjusting based on the detected frequency change, wherein the step size is determined based on the detected frequency change.

In a preferred embodiment, generating the pilot signal is generated using feedback from the output of the amplifier system. Adjusting one or more parameters may include adjusting the in-phase and quadrature components of the gain of a signal path in the control loop using a vector modulator. A direction of the vector modulator adjustment may be changed based on the detected frequency change in the pilot signal.

The generated pilot signal is preferably an RF signal, and detecting the frequency of the generated pilot signal includes detecting an RF frequency of the RF signal or by detecting an IF frequency of an IF signal before the IF signal is up-converted to the RF signal.

The method may further include reducing the step size if a phase change of a cancellation transfer function of the control loop is larger than a predetermined value, wherein the phase change is proportional to the frequency change, and the predetermined value depends on a directional error of the predetermined direction.

In another aspect, the present invention provides a method for controlling alignment of a feed forward amplifier system. The system includes an input for receiving an input signal, a first carrier cancellation control loop coupled to the input and having a main amplifier, a second error cancellation control loop coupled to the first carrier cancellation control loop and having an error amplifier and a vector modulator, and an output coupled to the second error cancellation control loop and providing an output signal. The method includes sampling the output signal, generating a pilot signal from the output signal and injecting the generated pilot signal into the first carrier cancellation control loop, detecting a first frequency of the generated pilot signal, adjusting the vector modulator in the second control loop from a first adjustment setting to a second adjustment setting using an alignment direction and at a predetermined step size, detecting a second frequency of the generated pilot signal after the adjusting, calculating a difference between the first frequency and the second frequency, altering the alignment direction using the frequency difference, and adjusting a setting of the vector modulator in the second error cancellation control loop from the second adjustment setting to a third setting using the altered alignment direction and the altered predetermined step size, wherein the predetermined step size is controlled by limiting the frequency difference.

In a preferred embodiment, limiting the frequency difference is realized by limiting a phase change of a transfer function of the second error cancellation control loop to be smaller than a predetermined value, wherein the phase change is proportional to the frequency difference. The method may further include reducing the predetermined step size if the phase change is not less than the predetermined value. The predetermined value may depend on a directional error of the alignment direction.

The generated pilot signal is preferably an RF signal generated by up converting an IF signal, and detecting the frequency of the generated pilot signal comprises detecting an RF frequency of the generated pilot signal or detecting an IF frequency of the IF signal.

In another aspect, the present invention provides a feed forward amplifier, including an RF input for receiving an RF signal, a carrier cancellation loop having a main amplifier receiving and amplifying the RF signal and providing an estimate of a distortion introduced by the main amplifier, an error cancellation loop for reducing the distortion, a positive feedback pilot system having a pilot detection circuit including a detector for detecting a sampled signal from a delayed output of the main amplifier and a pilot generation circuit for generating and injecting a generated pilot signal into the carrier cancellation loop using the sampled signal, a frequency measurement module for measuring a frequency of the generated pilot signal, and means for adjusting one or more parameters in the error cancellation loop using a loop control algorithm. A step size for adjusting the one or more parameters is determined based on the frequency measurement.

In a preferred embodiment, the detector is also adapted to detect a power of the sampled signal, which power varies with strength of an uncancelled distortion from the error cancellation loop.

The positive feedback pilot system preferably includes means for generating an intermediate frequency pilot signal from the sampled pilot signal, a local oscillator providing a fixed frequency signal, and a mixer receiving the intermediate frequency pilot signal and fixed frequency signal and outputting the generated pilot signal at an RF frequency. The positive feedback pilot system further includes comprises a sampling coupler coupled to the pilot generation circuit at an input or at an output of the mixer and providing a sampled IF or RF pilot signal to the frequency measurement module, and the frequency measurement module detects an IF or RF frequency of the pilot signal.

The means for generating an intermediate frequency pilot signal may include a second mixer coupled to the local oscillator and receiving the sampled pilot signal and providing an intermediate frequency sampled output signal and a band limiter for providing a band limited signal corresponding to uncancelled pilot signal in the sampled signal.

The loop control algorithm preferably iteratively adjusts an alignment direction to minimize a detected frequency change. The loop control algorithm adjusts an amount of alignment direction change based on successive increases or decreases in the detected frequency change.

The loop control algorithm may be adapted to iteratively adjust one or more parameters of the error cancellation loop with a predetermined step size, and the predetermined step size is controlled based on a detected frequency change. The predetermined step size is reduced when a change in phase of a transfer function of the error cancellation loop is larger than a predetermined value determined from a directional error of an alignment direction.

Further aspects of the construction and method of operation of the invention, with additional objects and advantages thereof, will be best understood from the following description of specific embodiments when read in connection with the accompanying drawings.

BRIEF DESCRIPTION OF THE DRAWINGS

FIG. 8 is a plot of search trajectories from four starting points: $(\alpha+j\beta)=(150+j300)$, $(150+j50)$, $(400+j300)$, and $(400+j50)$. Each trajectory converges to $(271+j187)$. Initial direction is $\theta=0$ in each case.

FIGS. 9A and 9B are plots showing alignment error vs. time (number of iterations) for an algorithm of the invention and a baseline coordinate descent algorithm, respectively. The search trajectory starts at $(400+j300)$.

DETAILED DESCRIPTION

The present invention will now be described, by way of example, the best mode contemplated by the inventors for carrying out the present invention, in reference with the accompanying drawings. It shall be understood that the following description, together with numerous specific details, may not contain specific details that have been omitted as it shall be understood that numerous variations are possible and thus will be detracting from the full understanding of the present invention. It will be apparent, however, to those skilled in the art, that the present invention may be put into practice while utilizing various techniques.

The present invention provides a feed forward amplifier system and method using the pilot frequency from a positive feedback pilot generation and detection circuit to improve the second loop convergence.

A positive feedback pilot generation system is disclosed in U.S. patent application Ser. No. 10/838,985 filed May 5, 2004, now U.S. Pat. No. 7,123,086, and assigned to the assignee of the present invention, the disclosure of which is incorporated herein by reference in its entirety. The pilot generation and detection system of the above-noted Ser. No. 10/838,985 application operates using an intermediate frequency (IF) detection circuit and positive feedback. It is used in a feed forward power amplifier to assist the automatic control of the second loop alignment. The pilot system generates a pilot tone when the second loop of a feed forward amplifier is misaligned. The pilot system also detects the residual pilot at the output of the feed forward amplifier, after the second loop cancellation. A voltage proportional to the log of the detected power is provided from the pilot system to an adaptive alignment controller. The adaptive controller adjusts the alignment of the second loop to minimize the detector voltage (log of the residual pilot power).

By detecting the frequency of the generated pilot tone, the system controller can use the frequency information to control the direction of the alignment adjustment steps to improve the convergence speed of second loop alignment.

Figure 1:
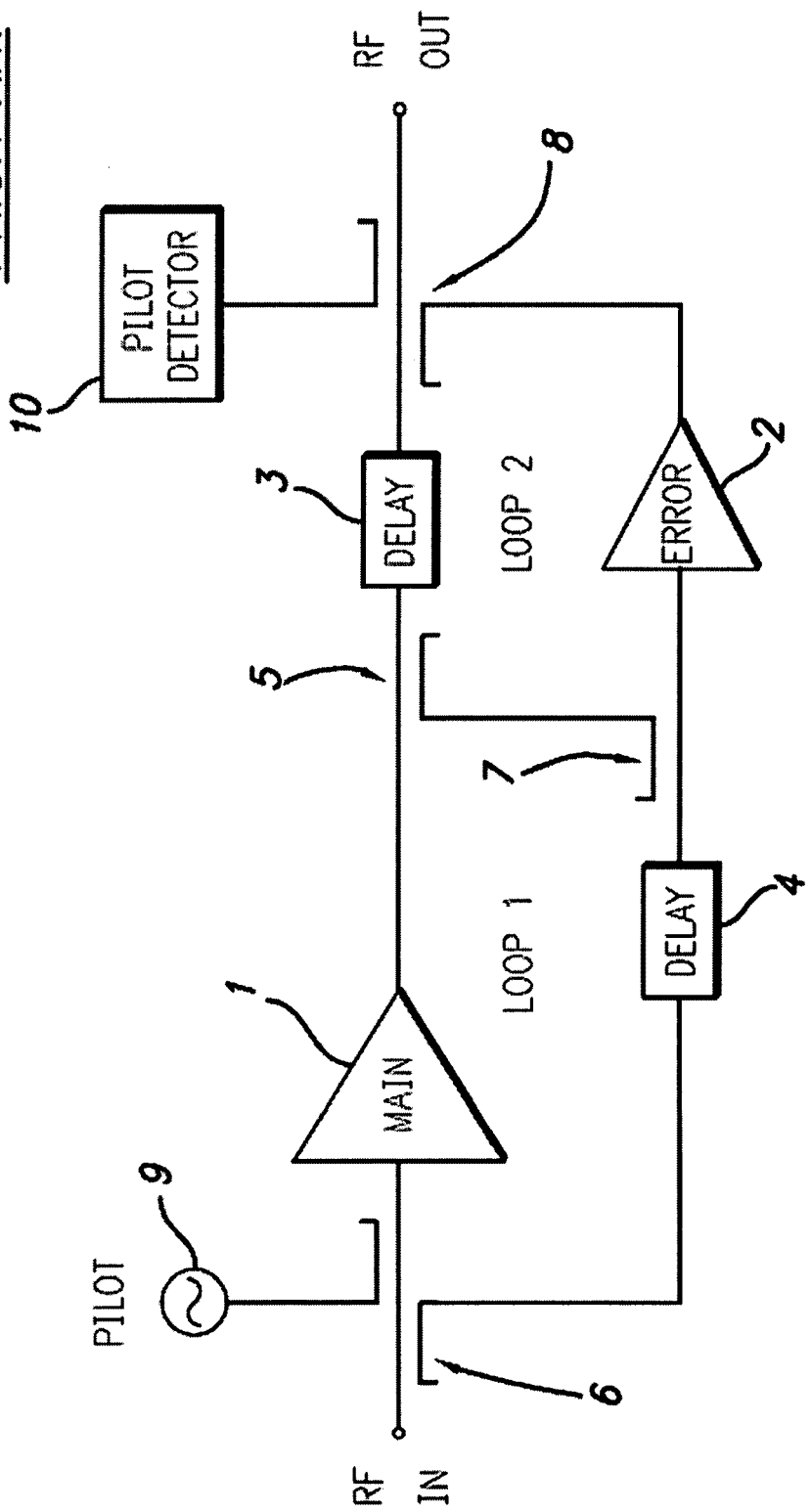
FIG. 1 is a block schematic drawing of a prior art feed forward power amplifier.
Figure 2:
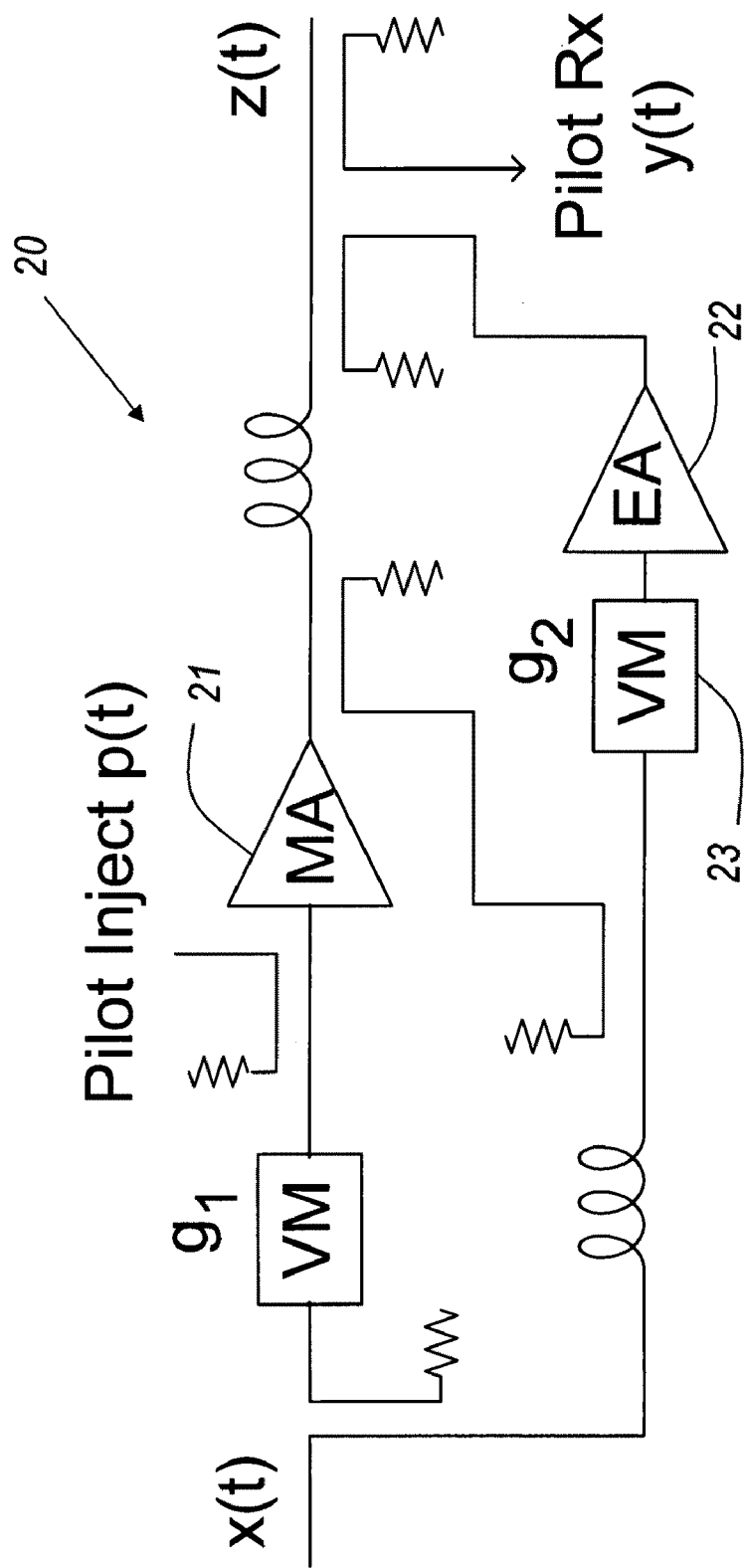
FIG. 2 is a block schematic drawing of a feed forward power amplifier employing a positive feedback pilot generation and detection circuit in accordance with the present invention.

Referring to FIG. 2, a feed forward power amplifier 20 in accordance with an embodiment of the invention comprises four RF paths: a main amplifier (MA) 21 path; a reference path that provides a delayed version of the carrier (input) signal, x(t); an output delay path that is a delayed version of the MA output signal; and an error amplifier (EA) 22 path. The RF paths combine to form two cancellation loops: the first loop cancels the carrier signal to produce an estimate of the distortion within the MA path; the second loop uses the distortion estimate to cancel or reduce the distortion from the output delay path.

The feed forward amplifier of the present invention may also incorporate known features other than the novel aspects described in detail herein and such known features will not be described in detail. For example, additional features of a feed forward amplifier architecture and control system are described in U.S. Pat. No. 6,794,933, assigned to the assignee of the present invention, the disclosure of which is incorporated herein by reference in its entirety.

The second loop cancellation transfer function is of interest; it represents the gain difference between the signals traveling along the output delay path and the error amplifier path. The error amplifier path contains a vector modulator (VM) 23, whose complex gain is denoted by $g_2$, which allows the alignment of the two signals to be controlled.

A pilot signal, p(t), located outside the carrier bandwidth, is often used to measure the second loop cancellation transfer function. The pilot signal is injected into the main amplifier path, becoming an additive distortion. The loop alignment involves the adjustment of the vector modulator ($g_2$) to minimize the residual pilot detected at the output coupler, y(t).

Figure 3:
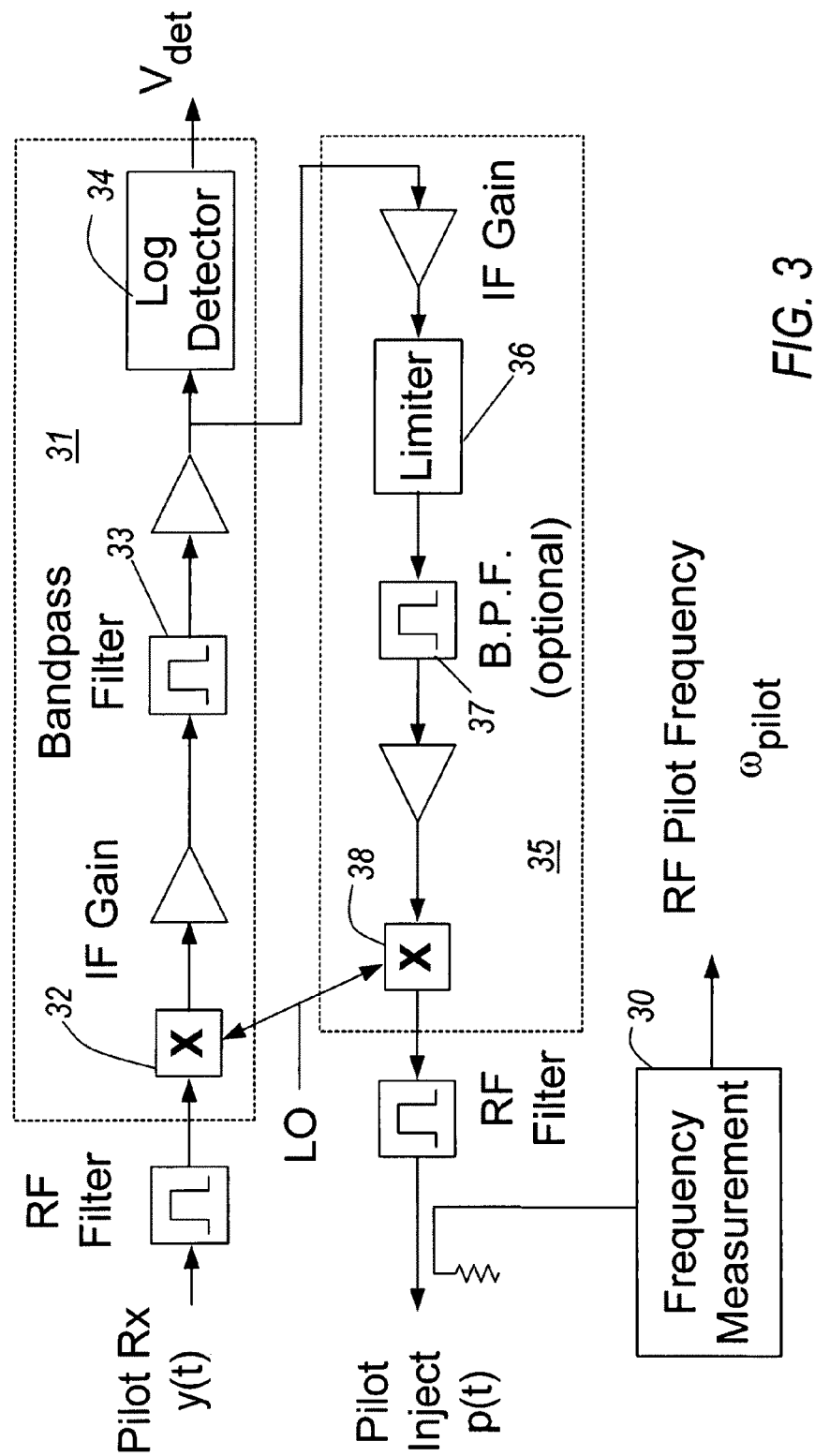
FIG. 3 is a block schematic drawing of an embodiment of the positive feedback pilot generation and detection circuit employed in the feed forward power amplifier of FIG. 2 with measurement of pilot frequency at RF.

The block diagram of the positive feedback pilot system, including the pilot frequency measurement module 30, is shown in FIG. 3. The frequency measurement module 30 may include a spectrum analyzer to measure the frequency of the pilot signal.

The search algorithm of the invention uses the frequency difference of the pilot before and after a step in the alignment settings. It should be appreciated that frequency measurements can be obtained from other positions within the RF and intermediate frequency (IF) circuits and that such implementations are equally within the scope of the present invention. For example, although FIG. 3 shows the frequency measurement is performed at RF, the frequency measurement can be performed at IF instead.

The top portion of the system is an IF detection circuit 31, which comprises a down-converting mixer 32, a bandpass filter 33, and a log detector 34. The bottom portion is the pilot generation circuitry 35, which feeds back the bandpass filtered IF signal from the detection path through a limiter 36, an optional bandpass filter 37, and an up-converting mixer 38. The input to the system is y(t), which is coupled from the RF output of the feedforward PA 20. The outputs of the original pilot system include the generated pilot p(t) and the detected residual pilot power, $V_{det}$.

Bandpass filtering using the filter 33 within the pilot detection circuit 31 prevents the carrier (linear signal) power from reaching the detector 34. The center RF frequency of the IF detection circuit 31 passband is made tunable by varying the LO frequency. The bandwidth of the IF detection is determined primarily by the filter 33. Bandpass filtering also restricts the frequency range of the generated pilot.

When connected to the feedforward PA, the pilot system creates a positive feedback loop through the main amplifier 21 and the second loop of the feedforward amplifier, which produces a narrow bandwidth tone. The actual pilot frequency, $\omega_{pilot}$, will vary so that the feedback has the zero phase margin required for oscillation. The limiter 36 in the pilot generation circuit 35 ensures that the unity loop gain (zero gain margin) requirement for oscillation is also met.

By measuring the frequency of the pilot, as shown in FIG. 3, a faster search algorithm for the second loop alignment is developed. The frequency of the generated pilot generated is a natural mode of the positive feedback. It must be within the passband of the pilot system and create a loop phase that is a multiple of $2\pi$ radians:

$$n \cdot 2\pi = \omega_{pilot} \cdot \Delta_{fb,loop} + \phi + \phi_{offset}, \quad (1)$$

where $\omega_{pilot}$ is the pilot frequency, $\Delta_{fb,loop}$ is the total loop delay of the feedback, $\phi$ is the phase of the second cancellation transfer function and $\phi_{offset}$ is the phase offset. From Eq. (1), changes in the phase of the second loop cancellation transfer function cause changes in the pilot frequency. Note that either IF or RF measurements of the pilot frequency may be used because the frequency difference associated with a change in the second loop alignment is of interest.

The cancellation transfer function of the second loop is determined by the misalignment of $g_2$ (see FIG. 2). Assume that the complex gain of the vector modulator is $$g_2 = (\alpha_{opt} + \Delta\alpha_{opt}) + j(\beta_{opt} + \Delta\beta_{opt}), \quad (2)$$

where $\alpha_{opt}$ and $\beta_{opt}$ are the optimal in-phase and quadrature alignment settings, respectively, and $\Delta\alpha_{opt}$ and $\Delta\beta_{opt}$ are the respective misalignments. The second loop cancellation transfer function is $(\Delta\alpha_{opt} + j\Delta\beta_{opt})$. The detector output is $$V_{det} \approx \log\{|\rho|^2 \cdot [(\Delta\alpha_{opt})^2 + (\Delta\beta_{opt})^2] + P_{min}\}, \quad (3)$$

where $|\rho|$ and $P_{min}$ are constants. It can be seen from Eq. (3) that when the detected voltage is plotted as a function of the in-phase and quadrature settings, the resulting iso-contours are concentric ellipses surrounding the optimal alignment setting (see FIG. 4). The phase shift of the second loop cancellation transfer function at iteration 'n' is $$\phi_n = \arctan\left[\frac{\Delta\beta_{opt}}{\Delta\alpha_{opt}}\right] = \arctan\left[\frac{\beta_n - \beta_{opt}}{\alpha_n - \alpha_{opt}}\right]. \quad (4)$$

Consider the case where the initial alignment setting is $(\alpha_1, \beta_1)$ and the alignment after the step $(\Delta\alpha_1, \Delta\beta_1)$ is $(\alpha_2, \beta_2) = (\alpha_1 + \Delta\alpha_1, \beta_1 + \Delta\beta_1)$. The magnitude of the first step (also referred to as the "step size") is $$s_1 = [(\alpha_2 - \alpha_1)^2 + (\beta_2 - \beta_1)^2]^{0.5}. \quad (5)$$

The direction of the first step within the 2D $g_2$ space is $$\theta_1 = \arctan\left[\frac{\beta_2 - \beta_1}{\alpha_2 - \alpha_1}\right]. \quad (6)$$

Figure 4:
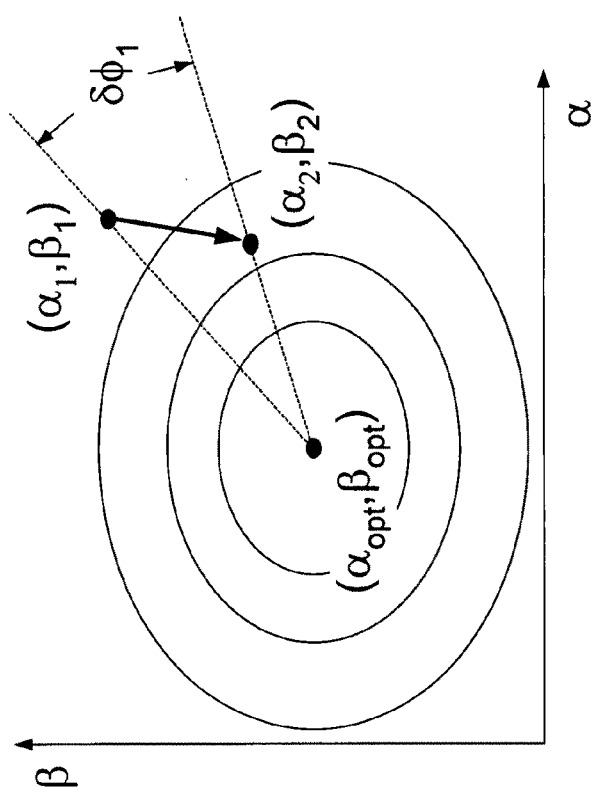
FIG. 4 is a contour plot illustrating the residual pilot power, $V_{det}$, as a function of $\alpha$ and $\beta$, and phase change $\delta\phi$, in response to alignment step $(\alpha_2-\alpha_1, \beta_2-\beta_1)$.

The change in phase of the second loop cancellation transfer function due to the step, shown in FIG. 4, is $$\delta\phi_1 = \phi_2 - \phi_1. \quad (7)$$

From Eq. (1), the change in pilot frequency associated with moving the alignment setting from $(\alpha_1, \beta_1)$ to $(\alpha_2, \beta_2)$ is $$\partial\omega_{pilot,1} = -\frac{\delta\phi_1}{\Delta_{fb,loop}}. \quad (8)$$

Figure 5:
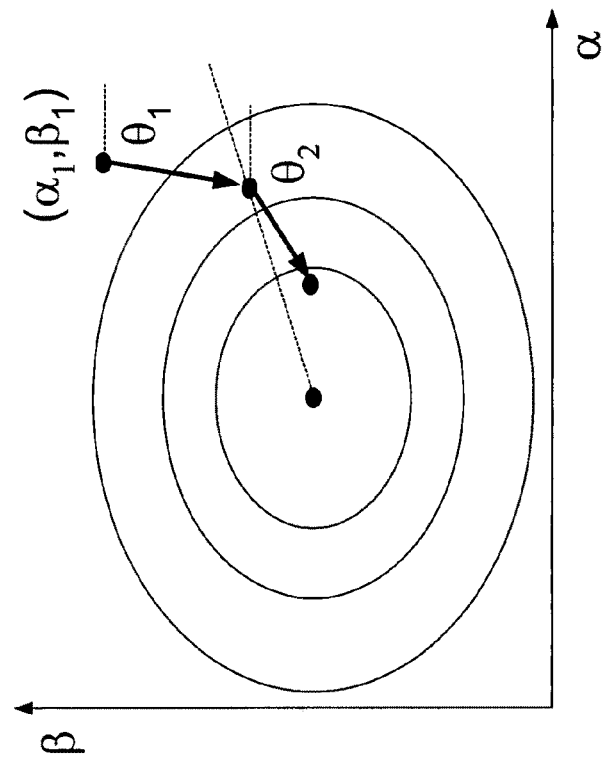
FIG. 5 is a contour plot illustrating change in step direction $\theta$ based on pilot frequency change, $\delta\omega_{pilot,1}$.

Frequency change information is used to select the direction of the next step. In a first approach for controlling the step direction, the optimal direction at iteration 'n' is the same as the phase of the second loop cancellation transfer function (see Eq. (4)). Thus, the directional error is $\Delta\theta_1 = \theta_1 - \phi_1$. Using the change in pilot frequency to reduce the direction error, the second step direction is selected as $$\theta_2 = \theta_1 + k_\theta \cdot \omega_{pilot,1}, \quad (9)$$

where $k_\theta$ is a scalar value that varies with $\Delta_{fb,loop}$, $[(\Delta\alpha_1)^2 + (\Delta\beta_1)^2]^{0.5}$, and inversely with the step size, $s_1$. The updated trajectory is shown FIG. 5.

Proper selection of the step size ensures convergence of the iterative sequence. In accordance with an embodiment of the invention, the step size is controlled by limiting the change in phase of the second loop cancellation transfer function to be less than a predetermined value. Assuming that $|\Delta\theta| < \pi/2$, the predetermined value is $\pi/2 - |\Delta\theta|$. To avoid overshooting the local minimum of $V_{det}$ (see Eq. (3)), the step size must be sufficiently small such that $$|\delta\phi| < \frac{\pi}{2} - |\Delta\theta|. \quad (10)$$

Thus, the step size is reduced whenever $|\delta\phi|$ becomes large. In general, $|\Delta\theta|$ for the current iteration is not known ahead of time; however, an estimate of the bound on $|\Delta\theta|$ can be used instead within Eq. 10 where the bound may be estimated from direction changes performed in past iterations.

Figure 10:
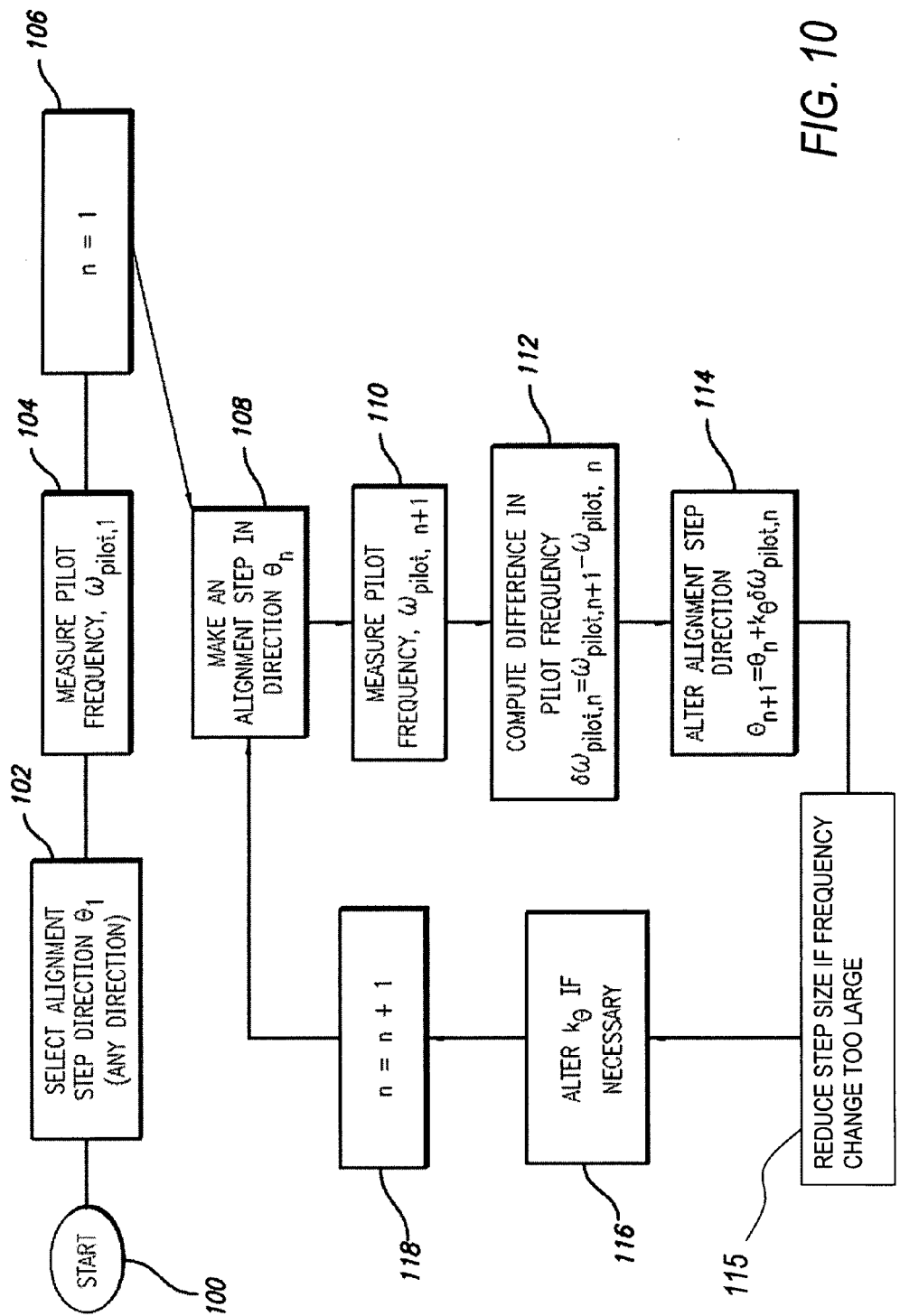
FIG. 10 is a flow diagram illustrating an algorithm for selecting the step direction and the step size in the second loop alignment search in accordance with an embodiment of the invention.

A preferred embodiment of the algorithm for selecting the step direction $\theta_{n+1}$ and the step size in the alignment search is shown in FIG. 10. After starting the algorithm at step 100, at step 102 an initial alignment step direction is selected, which the initial direction may be arbitrary. Next at step 104 the algorithm proceeds to measure the pilot frequency. At step 106 a counter is initialized to begin a series of alignment steps using measurements of the pilot frequency to optimize the step direction. More specifically, at step 108, the algorithm initiates an alignment step $(\Delta\alpha_1, \Delta\beta_1)$ in the initial alignment direction by incrementing the vector modulator settings corresponding to the selected direction. Next, at step 110 the algorithm proceeds to measure the pilot frequency at the new settings. At step 112, the algorithm proceeds to compute frequency change in response to the change in settings. Next at step 114 the difference in pilot frequency, determined at 112, is used to alter the alignment step direction, multiplying the difference in frequency by a constant value $k_\theta$ defining the amount of change in step direction (i.e. the size of the angle of direction change in 2D $g_2$ space).

Next at step 115 the step size may be reduced if necessary as determined by Eq. (10). At 116 it is determined if the value of the constant $k_\theta$ is too large or too small and if necessary the value of the constant $k_\theta$ is increased or decreased. At step 118 the counter is incremented and the alignment adjustment step direction processing flow including steps 108, 110, 112, 114, 115, and 116 is repeated. This iterative process flow continues as long as it is converging, which is indicated by a decreasing level of the detected pilot power $V_{det}$. $V_{det}$ is measured at 104 and 110, and the difference, $\Delta V_{det}$, is computed at 112. The search is converging as desired when $\Delta V_{det} < 0$.

Rather than selecting $k_\theta$, it is possible to base the search direction on the sign of the difference in the pilot frequency $(\delta\omega_{pilot})$. In a second approach for controlling the step direction, the search direction is updated using $$\theta_2 = \theta_1 + \text{sgn}\{\partial \omega_{pilot,1}\} \cdot \frac{\pi}{4}, \quad (11)$$

when $V_{det}$ is decreasing (converging, $\Delta V_{det}<0$), and $$\theta_2 = \theta_1 + \text{sgn}\{\partial \omega_{pilot,1}\} \cdot \frac{3\pi}{4}, \quad (12)$$

when $V_{det}$ is increasing (diverging, $\Delta V_{det}>0$). The lateral movement associated with Eqs. (11) and (12) changes the angle $|\delta\phi|$ (see FIG. 4) periodically, allowing the step size to be controlled accurately using Eq. (10).

In accordance with an embodiment of the invention, the step size is adjusted as follows. The step size is increased by factors of 1.4 and 1.2 when $|\delta\phi|<0.05$ and 0.07, respectively, and decreased by a factor of 0.5 when $|\delta\phi|>0.3$. The step size is reduced by a factor of 0.7 when $\Delta V_{det}>0$ and $V_{det}<80$ (see FIG. 6), and increased by 30 DAC counts when $\Delta V_{det}>0$ and $V_{det}>120$. The former condition occurs when the search overshoots the optimal setting; the latter condition indicates divergence associated, typically, with an incorrect selection of the initial direction $\theta_1$.

The loop control algorithm can be programmed in any programmed device using any programming language, and can be implemented in commercially-available software package such as Matlab. A GPIB can be used to link to communicate with the spectrum analyzer. An RS232 serial link may be used to communicate with the power amplifier, receiving residual pilot power measurements, and sending alignment settings. The firmware on the PA controlling the loop alignment may be disallowed giving control to the Matlab-based algorithm.

Figure 7:
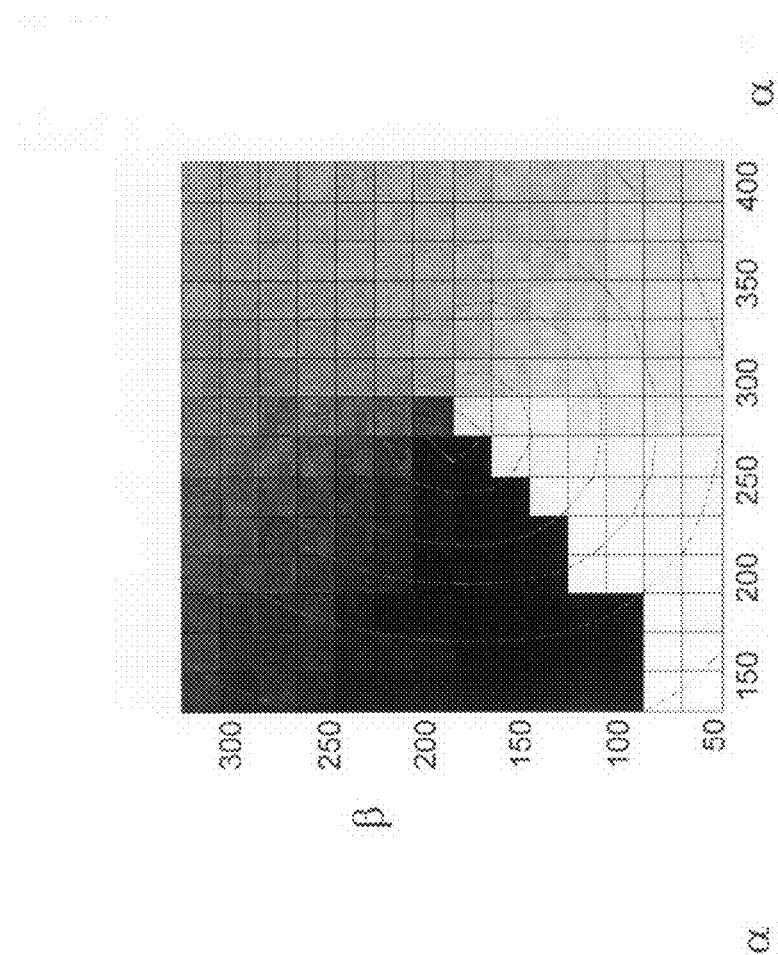
FIG. 7 is a 2-D map of measured pilot frequency vs. alignment setting ($\alpha+j\beta$). Darker squares have a lower frequency.
Figure 6:
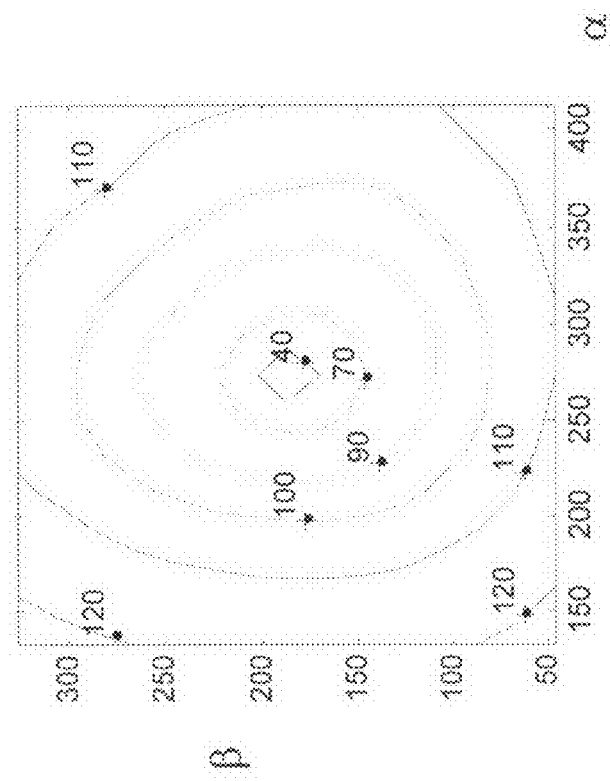
FIG. 6 is a contour plot illustrating the residual pilot power, $V_{det}$ (DAC values), as a function of the in-phase ($\alpha$) and quadrature ($\beta$) alignment settings of $g_2$ (in DAC values).

The measured contours of the log-power detection are plotted as a function of the in-phase ($\alpha$) and quadrature ($\beta$) components of alignment settings ($g_2$) in FIG. 6. The measured pilot frequencies are plotted using a 2-D map in FIG. 7. To illustrate the relationship between the two measurements, the log-power contours are overlaid onto the frequency map. The optimal alignment setting is $\alpha_{opt}+j\beta_{opt}=271+j187$, measured in DAC values. The log-power contours have an elliptical shape surrounding the optimal alignment setting, and the frequencies change as a function of $\phi$ (defined by Eq. (4)), as desired. The discontinuity in the frequency map, which corresponds to a $2\pi$ wrap-around in phase, does not affect the algorithm because the frequency difference measurements are unwrapped such that $-\pi/\Delta_{fb,loop}<\delta\omega_{pilot}<\pi/\Delta_{fb,loop}$. As seen in FIG. 7, there is a good correspondence between the angle $\phi$ (extending from $271+j187$) and the pilot frequency $\omega_{pilot}$. The discontinuity (bottom-left) is due to a $2\pi$ wrap-around. Overlaid contours represent the residual pilot power shown in FIG. 6.

Four search trajectories for the proposed algorithm are shown in FIG. 8. The initial alignments are $(\alpha+j\beta)=(150+j300)$, $(150+j50)$, $(400+j300)$, and $(400+50)$. The initial direction $\theta_1$ is zero in each case, which means that the first step moves away from the optimal setting for the last two examples. Each trajectory converges to the optimal setting. Using $V_{det}<30$ as a threshold for complete convergence, the four trajectories converge in 13, 14, 15, and 11 iterations, respectively.

A coordinate descent search based on minimizing the detector voltage ($V_{det}$) only is used for comparison: from the four starting alignments, the baseline algorithm required 24, 24, 27, and 30 iterations to converge. The algorithm in accordance with embodiments of the invention is faster because of better control of the step size where reductions occur prior to overshooting the optimal setting, and because both the frequency and the power of the pilot can be used to adjust the step size. Concurrent adjustments of $\alpha$ and $\beta$ also contribute to the improved performance.

The alignment error for the slowest of the four trajectories, where the initial alignment is $(400+j300)$, is plotted in FIG. 9A as a function of time (number of iterations). Also shown is the alignment error for the coordinate descent search in FIG. 9B. The search trajectory of the algorithm in accordance with embodiments of the invention is better damped, and converges faster than the baseline coordinate descent search.

Figure 11:
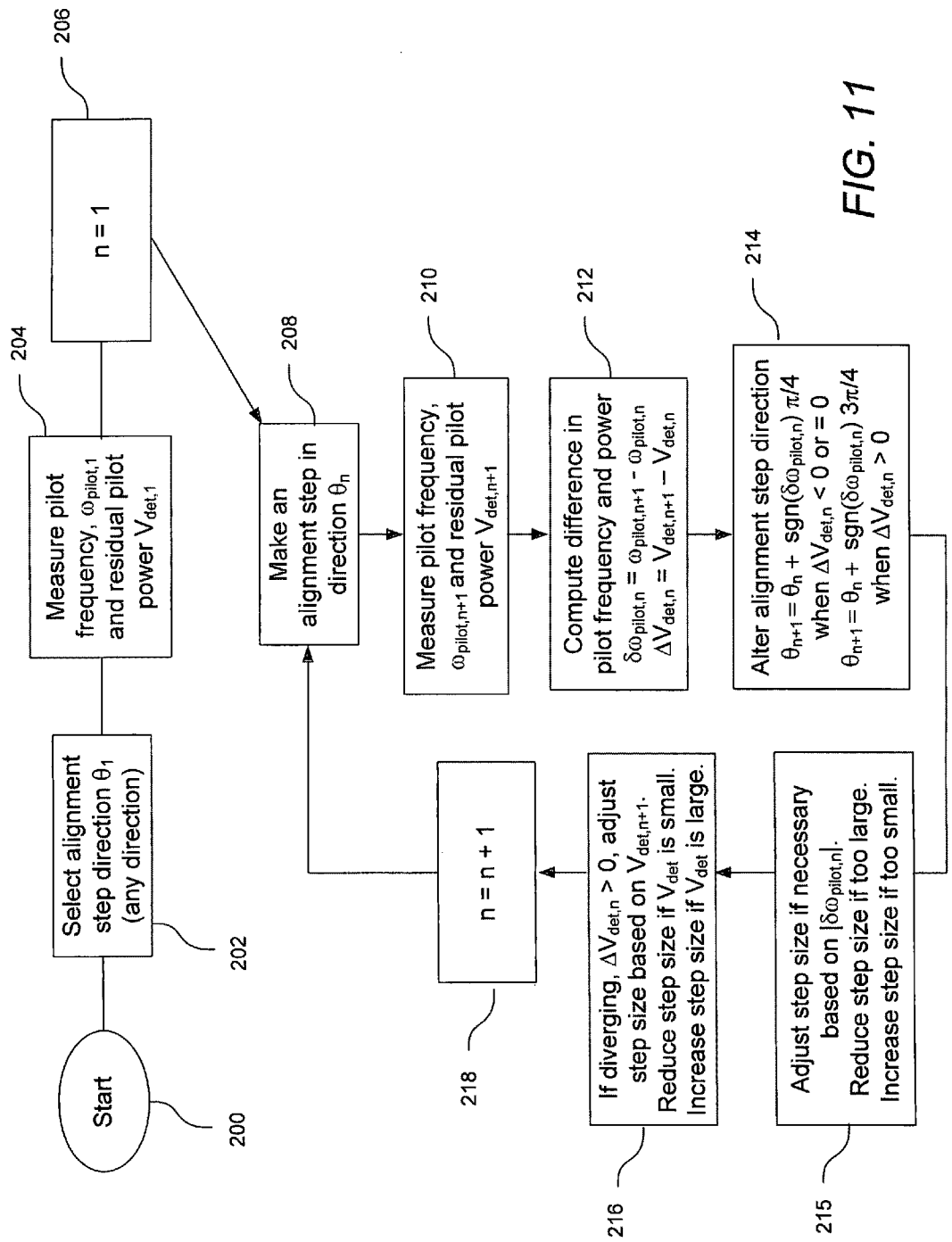
FIG. 11 is a flow diagram illustrating an algorithm for selecting the step direction and the step size in the second loop alignment search in accordance with a second embodiment of the invention.

A second embodiment of the algorithm for selecting the step direction $\theta_{n+1}$ and the step size in the alignment search is shown in FIG. 11. After starting the algorithm at step 200, at step 202 an initial alignment step direction is selected, which the initial direction may be arbitrary. Next at step 204 the algorithm proceeds to measure the pilot frequency and residual pilot power $V_{det}$. At step 206 a counter is initialized to begin a series of alignment steps using measurements of the pilot frequency and residual pilot power to select the step direction. More specifically, at step 208, the algorithm initiates an alignment step $(\Delta\alpha_1, \Delta\beta_1)$ in the initial alignment direction by incrementing the vector modulator settings corresponding to the selected direction. Next, at step 210 the algorithm proceeds to measure the pilot frequency and residual pilot power at the new settings. At step 212, the algorithm proceeds to compute frequency change and pilot power change in response to the change in settings. Next at step 214 the signs of the difference in pilot frequency and difference in pilot power, determined at 212, are used to alter the alignment step direction based on Eq. (11) and Eq. (12).

Next at step 215 the step size may be altered if necessary. The step size is increased if the magnitude of frequency change is small and decreased if the magnitude of the frequency change is large. At 216, it is determined if the search for the optimal alignment is diverging as indicated by $\Delta V_{det}>0$ and if so, the step size is decreased if the search is near the optimal alignment, as indicated by a low value of $V_{det}$, or increased if the alignment is far from its optimal value, as indicated by a high value of $V_{det}$. At step 218 the counter is incremented and the alignment adjustment step direction processing flow including steps 208, 210, 212, 214, 215, and 216 is repeated. This iterative process flow continues as long as it is converging, on average, which is indicated by a decreasing level of the detected pilot power $V_{det}$. $V_{det}$ is measured at 204 and 210, and the difference, $\Delta V_{det}$, is computed at 212. The search is converging as desired when $\Delta V_{det}<0$.

Advantageously, measuring the pilot frequency provides information regarding the phase of the second loop cancellation transfer function, which is used in a new algorithm to control the alignment setting. The algorithm exhibits faster convergence than a coordinate descent search algorithm based on the minimizing the detector voltage only.

The present invention has been described in relation to a presently preferred embodiment, however, it will be appreciated by those skilled in the art that a variety of modifications, too numerous to describe, may be made while remaining within the scope of the present invention. Accordingly, the above detailed description should be viewed as illustrative only and not limiting in nature.

What is claimed is:

1. A method for controlling alignment of a control loop in an amplifier system, comprising:

generating a pilot signal and injecting the pilot signal into the amplifier system;

detecting any uncanceled pilot signal at an output of the control loop;

detecting a frequency of the generated pilot signal;

adjusting one or more parameters of the control loop at a predetermined direction and with a predetermined step size;

detecting a frequency change in the pilot signal in response to said adjusting; and iteratively aligning the control loop by controlling said adjusting based on the detected frequency change, wherein the step size is determined based on the detected frequency change; and wherein generating the pilot signal is by using feedback from the output of the amplifier system.

2. A method for controlling alignment of a control loop in an amplifier system as set out in claim 1, wherein the generated pilot signal is an RF signal, and wherein detecting the frequency of the generated pilot signal comprises detecting an RF frequency of the RF signal or by detecting an IF frequency of an IF signal before the IF signal is up-converted to the RF signal.

3. A method for controlling alignment of a control loop in an amplifier system as set out in claim 1, further comprising reducing the step size if a phase change of a cancellation transfer function of the control loop is larger than a predetermined value, wherein the phase change is proportional to the frequency change, and the predetermined value depends on a directional error of the predetermined direction.

4. A method for controlling alignment of a control loop in an amplifier system comprising:

generating a pilot signal and injecting the pilot signal into the amplifier system;

detecting any uncanceled pilot signal at an output of the control loop;

detecting a frequency of the generated pilot signal;

adjusting one or more parameters of the control loop at a predetermined direction and with a predetermined step size;

detecting a frequency change in the pilot signal in response to said adjusting; and iteratively aligning the control loop by controlling said adjusting based on the detected frequency change, wherein the step size is determined based on the detected frequency change; and wherein said adjusting one or more parameters comprises adjusting the in-phase and quadrature components of the gain of a signal path in the control loop using a vector modulator.

5. A method for controlling alignment of a control loop in an amplifier system as set out in claim 4, wherein a direction of the vector modulator adjustment is changed based on said detected frequency change in the pilot signal.

6. A method for controlling alignment of a feed forward amplifier system comprising an input for receiving an input signal, a first carrier cancellation control loop coupled to the input and having a main amplifier, a second error cancellation control loop coupled to the first carrier cancellation control loop and having an error amplifier and a vector modulator, and an output coupled to the second error cancellation control loop and providing an output signal, the method comprising:

sampling the output signal;

generating a pilot signal from the output signal and injecting the generated pilot signal into the first carrier cancellation control loop;

detecting a first frequency of the generated pilot signal;

adjusting the vector modulator in said second control loop from a first adjustment setting to a second adjustment setting using an alignment direction and at a predetermined step size;

detecting a second frequency of the generated pilot signal after said adjusting;

calculating a difference between the first frequency and the second frequency;

altering the alignment direction using the frequency difference; and adjusting a setting of the vector modulator in said second error cancellation control loop from the second adjustment setting to a third setting using the altered alignment direction and the altered predetermined step size, wherein the predetermined step size is controlled by limiting said frequency difference.

7. A method for controlling alignment of a feed forward amplifier system as set out in claim 6, wherein limiting the frequency difference is realized by limiting a phase change of a transfer function of the second error cancellation control loop to be smaller than a predetermined value, wherein the phase change is proportional to the frequency difference.

8. A method for controlling alignment of a feed forward amplifier system as set out in claim 7, further comprising reducing the predetermined step size if the phase change is not less than the predetermined value.

9. A method for controlling alignment of a feed forward amplifier system as set out in claim 8, wherein the predetermined value depends on a directional error of the alignment direction.

10. A method for controlling alignment of a feed forward amplifier system as set out in claim 6, wherein the generated pilot signal is an RF signal generated by up converting an IF signal, and wherein detecting the frequency of the generated pilot signal comprises detecting an RF frequency of the generated pilot signal or detecting an IF frequency of said IF signal.

11. A feed forward amplifier, comprising:

an RF input for receiving an RF signal;

a carrier cancellation loop comprising a main amplifier receiving and amplifying said RF signal and providing an estimate of a distortion introduced by the main amplifier;

an error cancellation loop for reducing the distortion;

a positive feedback pilot system comprising:

a pilot detection circuit comprising a detector for detecting a sampled signal from a delayed output of the main amplifier, and a pilot generation circuit for generating and injecting a generated pilot signal into the carrier cancellation loop using the sampled signal;

a frequency measurement module for measuring a frequency of the generated pilot signal;

means for adjusting one or more parameters in the error cancellation loop using a loop control algorithm, wherein a step size for adjusting the one or more parameters is determined based on the frequency measurement.

12. A feed forward amplifier as set out in claim 11, wherein the detector is adapted to detect a power of the sampled signal, which power varies with strength of an uncancelled distortion from the error cancellation loop.

13. A feed forward amplifier as set out in claim 11, wherein said positive feedback pilot system comprises means for generating an intermediate frequency pilot signal from the sampled pilot signal, a local oscillator providing a fixed frequency signal, and a mixer receiving the intermediate frequency pilot signal and fixed frequency signal and outputting the generated pilot signal at an RF frequency.

14. A feed forward amplifier as set out in claim 13, wherein said positive feedback pilot system further comprises a sampling coupler coupled to the pilot generation circuit at an input or at an output of the mixer and providing a sampled IF or RF pilot signal to said frequency measurement module, and wherein said frequency measurement module detects an IF or RF frequency of the pilot signal.

15. A feed forward amplifier as set out in claim 13, wherein said means for generating an intermediate frequency pilot signal comprises a second mixer coupled to the local oscillator and receiving the sampled pilot signal and providing an intermediate frequency sampled output signal and a band limiter for providing a band limited signal corresponding to uncancelled pilot signal in the sampled signal.

16. A feed forward amplifier as set out in claim 11, wherein said loop control algorithm iteratively adjusts an alignment direction to minimize a detected frequency change.

17. A feed forward amplifier as set out in claim 16, wherein said loop control algorithm adjusts an amount of alignment direction change based on successive increases or decreases in the detected frequency change.

18. A feed forward amplifier as set out in claim 11, wherein said loop control algorithm is adapted to iteratively adjust one or more parameters of said error cancellation loop with a predetermined step size, and wherein the predetermined step size is controlled based on a detected frequency change.

19. A feed forward amplifier as set out in claim 18, wherein the predetermined step size is reduced when a change in phase of a transfer function of the error cancellation loop is larger than a predetermined value determined from a directional error of an alignment direction.

* * * * *